(12) United States Patent
Cho

(10) Patent No.: US 8,384,448 B2
(45) Date of Patent: Feb. 26, 2013

(54) DLL CIRCUIT AND METHOD OF CONTROLLING THE SAME

(75) Inventor: Kwang-Jun Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 343 days.

(21) Appl. No.: 11/878,097

(22) Filed: Jul. 20, 2007

(65) Prior Publication Data

US 2008/0164920 A1      Jul. 10, 2008

(30) Foreign Application Priority Data

Jan. 10, 2007   (KR) .................. 10-2007-0002748

(51) Int. Cl.
  *H03L 7/06*   (2006.01)
(52) U.S. Cl. ........................ 327/156; 327/158
(58) Field of Classification Search .............. 327/156, 327/158, 172, 175
  See application file for complete search history.

(56) References Cited

U.S. PATENT DOCUMENTS

| | | | |
|---|---|---|---|
| 6,282,150 B1 * | 8/2001 | Edo ................... | 365/233.13 |
| 6,400,616 B1 * | 6/2002 | Tamura et al. ........ | 365/198 |
| 6,813,197 B2 | 11/2004 | Park | |
| 6,989,700 B2 | 1/2006 | Kim | |
| 7,103,133 B2 | 9/2006 | Jung | |
| 7,154,311 B2 | 12/2006 | Lim | |
| 7,170,313 B2 | 1/2007 | Shin | |
| 2006/0001463 A1 * | 1/2006 | Lee et al. ............ | 327/147 |
| 2006/0267649 A1 | 11/2006 | Park et al. | |
| 2007/0080732 A1 * | 4/2007 | Cho ................... | 327/175 |
| 2007/0200604 A1 * | 8/2007 | Yun et al. ............ | 327/158 |

FOREIGN PATENT DOCUMENTS

| | | |
|---|---|---|
| JP | 2005251370 | 9/2005 |
| KR | 1020040103035 | 12/2004 |
| KR | 1020050040565 | 5/2005 |
| KR | 1020050048838 | 5/2005 |
| KR | 1020050097700 | 10/2005 |
| KR | 1020060000865 | 1/2006 |
| KR | 1020060000866 | 1/2006 |
| KR | 1020060096635 | 9/2006 |

* cited by examiner

*Primary Examiner* — Lincoln Donovan
*Assistant Examiner* — Diana J Cheng
(74) *Attorney, Agent, or Firm* — Venable LLP; Jeffri A. Kaminski

(57) ABSTRACT

A DLL circuit includes a duty ratio correction unit that corrects the duty ratios of first and second delay clocks duty ratio to generate first and second correction clocks. A duty ratio detection unit detects the duty ratios of the first and second correction clocks, thereby generating first and second detection signals. A voltage comparison unit compares the levels of the first and second detection signals, thereby generating a first fine control signal. An operation mode setting unit generates a locking completion signal and a second fine control signal. A switching unit selectively transmits the first fine control signal or the second fine control signal to a delay control unit according to whether or not the locking completion signal is enabled.

29 Claims, 6 Drawing Sheets

DLL CIRCUIT AND METHOD OF CONTROLLING THE SAME

CROSS-REFERENCE TO RELATED PATENT APPLICATION

This application claims the benefit of Korean Patent Application No. 10-2007-0002748, filed on Jan. 10, 2007, in the Korean Intellectual Property Office, the disclosure of which is incorporated herein in its entirety by reference.

BACKGROUND OF THE INVENTION

1. Technical Field

The present invention relates to a DLL (Delay Locked Loop) circuit and a method of controlling the same, and in particular, to a DLL circuit that outputs a clock having an improved duty ratio quality and a method of controlling the same.

2. Related Art

Generally, a DLL circuit is used to supply an internal clock having an earlier phase than a reference clock, which is obtained by converting an external clock, for a predetermined time. The internal clock is generated to allow a semiconductor memory apparatus having relatively high integration, such as a synchronous DRAM (SDRAM) or the like, to operate in synchronization with the external clock.

More specifically, a clock input buffer receives the external clock and outputs the internal clock. At this time, the internal clock has a phase delayed from the phase of the external clock for a predetermined time by the clock input buffer. The phase of the internal clock is additionally delayed by delay elements in the semiconductor integrated circuit, and then transmitted to a data output buffer. Subsequently, the internal clock controls the data output buffer to output data.

Accordingly, there is a problem in that the output data is delayed as compared with the external clock. That is, a phase of the external clock is staggered with one of the output data.

To solve this problem, a DLL circuit is used. The DLL circuit adjusts the phase of the internal clock to be earlier than the external clock for a predetermined time. Accordingly, the output data is not delayed as compared with the external clock. That is, the DLL circuit receives the external clock and generates the internal clock having an earlier phase than the external clock for a predetermined time.

In a semiconductor memory apparatus, such as a DDR (Double Data Rate) SDRAM, which outputs data at rising time and falling time of the external clock, a dual loop type DLL circuit is used to generate a rising clock and a falling clock. The dual loop type DLL circuit includes feedback lines, each having a delay line, a delay modeling unit and a phase comparator. The individual delay lines perform coarse delay and fine delay operations according to an instruction from an operation mode setting unit to generate the rising clock and the falling clock. Further, in the DLL circuit, each feedback loop includes a phase mixer to perform an operation to adjust the duty ratio of the clock output from each of the delay lines to 50:50.

In the DLL circuit according to the related art, which includes a dual loop and controls the duty ratio of the clock using the phase mixer, after a delay locking operation of the clock is completed, only one feedback loop is activated, and the other feedback loop operates by being linked with the activated feedback loop. Accordingly, after the delay locking operation is completed, only one phase mixer is activated, and thus a clock generated does not have a correct duty ratio.

The phase mixer has a plurality of drivers that are provided at its pull-up section, a plurality of drivers that are provided at its pull-down section, and a driver that is provided to drive a voltage formed at a node between the pull-up section and the pull-down section. As such, the plurality of drivers provided in the phase mixer is controlled by a fixed control signal after the delay locking operation of the DLL circuit is completed. In this case, a change in driving ability between the pull-up section and the pull-down section may occur due to a change in PVT (Process, Voltage, and Temperature). However, the change cannot be adjusted by the fixed control signal. If the level of the voltage formed at the node between the pull-up section and the pull-down section is gradually changed due to the change in PVT, the duty ratio of an output clock may be significantly changed whenever each clock is input.

The DLL circuit according to the related art includes two feedback loops, each having a phase mixer, a delay modeling unit, a phase comparator, a duty ratio control unit, and the like. Accordingly, the area where the components are disposed is large. Further, power consumption of the individual components of the DLL circuit is high. As a result, low power consumption and high integration of the semiconductor integrated circuit are not easily realized.

SUMMARY OF THE INVENTION

Embodiments of the present invention provide a DLL circuit that outputs a clock having an improved duty ratio quality and a method of controlling the same.

An embodiment of the present invention provides a DLL circuit including: a duty ratio correction unit configured to correct the duty ratios of first and second delay clocks to generate first and second correction clocks; a duty ratio detection unit configured to detect the duty ratios of the first and second correction clocks, thereby generating first and second detection signals; a voltage comparison unit configured to compare the levels of the first and second detection signals, thereby generating a first fine control signal; an operation mode setting unit configured to generate a locking completion signal and a second fine control signal; and a switching unit configured to selectively transmit the first fine control signal or the second fine control signal to a delay control unit according to whether or not the locking completion signal is enabled.

Another embodiment of the present invention provides a DLL circuit including: a first feedback loop configured to receive a reference clock from a clock input buffer and to output a first clock; and a second feedback loop configured to receive the reference clock, while a delay locking operation is in progress, to generate a second clock by linking with an operation to generate the first clock, and, if the delay locking operation is completed, to correct the duty ratios of the first and second clocks.

Still another embodiment of the present invention provides a method of controlling a DLL circuit including: receiving a reference clock from a clock input buffer and performing a delay locking operation using first and second feedback loops to output first and second clocks; and correcting the duty ratios of the first and second clocks using the second feedback loop while generating the first clock by applying a fixed delay time to the reference clock using the first feedback loop.

DESCRIPTION OF EXEMPLARY EMBODIMENT

Hereinafter, an exemplary embodiment of the present invention will be described in detail with reference to the accompanying drawings.

Figure 1:
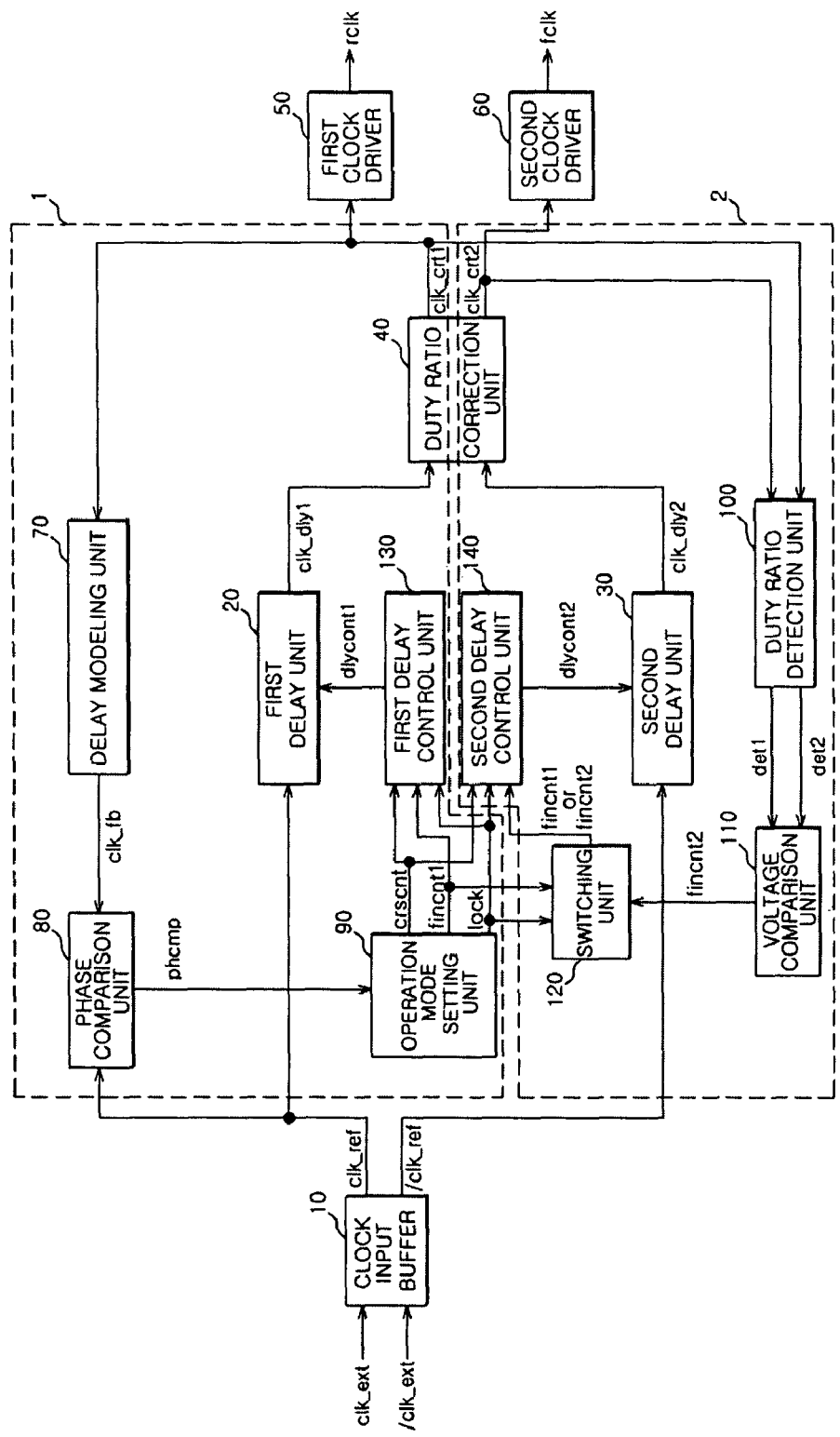
FIG. 1 is a block diagram illustrating a configuration of a DLL circuit according to an embodiment of the present invention.

Referring to FIG. 1, the DLL circuit includes a clock input buffer 10, a first delay unit 20, a second delay unit 30, a duty ratio correction unit 40, a first clock driver 50, a second clock driver 60, a delay modeling unit 70, a phase comparison unit 80, an operation mode setting unit 90, a duty ratio detection unit 100, a voltage comparison unit 110, a switching unit 120, a first delay control unit 130, and a second delay control unit 140.

The clock input buffer 10 buffers a pair of external clocks clk_ext and /clk_ext, thereby generating a pair of reference clocks clk_ref and /clk_ref.

The first delay unit 20 delays the positive reference clock clk_ref in response to a first delay control signal dlycont1, thereby outputting a first delay clock clk_dly1.

The second delay unit 30 delays the negative reference clock /clk_ref in response to a second delay control signal dlycont2, thereby outputting a second delay clock clk_dly2.

The duty ratio correction unit 40 corrects the duty ratios of the first and second delay clocks clk_dly1 and clk_dly2 to generate first and second correction clocks clk_crt1 and clk_crt2.

The first clock driver 50 drives the first correction clock clk_crt1, thereby outputting a rising clock rclk.

The second clock driver 60 drives the second correction clock clk_crt2, thereby outputting a falling clock fclk.

The delay modeling unit 70 delays the first correction clock clk_crt1 for a predetermined time, thereby generating a feedback clock clk_fb in order to perform modeling of a delay amount until the first correction clock clk_crt1 is transmitted to a data output buffer.

The phase comparison unit 80 compares the phase of the reference clock clk_ref with the phase of the feedback clock clk_fb, thereby generating a phase comparison signal phcmp.

The operation mode setting unit 90 outputs a locking completion signal lock, a coarse control signal crscnt, and a first fine control signal fincnt1 in response to the phase comparison signal phcmp.

The duty ratio detection unit 100 detects the duty ratios of the first and second correction clocks clk_crt1 and clk_crt2, thereby generating first and second detection signals det1 and det2.

The voltage comparison unit 110 compares the levels of the first and second detection signals det1 and det2 with each other, thereby generating a second fine control signal fincnt2.

The switching unit 120 selectively outputs the first fine control signal fincnt1 or the second fine control signal fincnt2 according to whether or not the locking completion signal lock is enabled.

The first delay control unit 130 generates the first delay control signal dlycont1 in response to the locking completion signal lock, the coarse control signal crscnt, and the first fine control signal fincnt1.

The second delay control unit 140 generates the second delay control signal dlycont2 in response to the locking completion signal lock, the coarse control signal crscnt, and the first fine control signal fincnt1 or the second fine control signal fincnt2.

The first delay unit 20, the duty ratio correction unit 40, the delay modeling unit 70, the phase comparison unit 80, the operation mode setting unit 90, and the first delay control unit 130 form a first feedback loop 1. Further, the second delay unit 30, the duty ratio correction unit 40, the duty ratio detection unit 100, the voltage comparison unit 110, and the switching unit 120 form a second feedback loop 2.

In the DLL circuit having the above-described configuration, before the delay locking operation is completed, the operation mode setting unit 90 disables the locking completion signal lock. In this state, the operation mode setting unit 90 sets a coarse mode to enable the coarse control signal crscnt. Subsequently, if the coarse mode operation ends, the operation mode setting unit 90 sets a fine mode to disable the coarse control signal crscnt and to enable the first fine control signal fincnt1. If the fine mode operation ends, the operation mode setting unit 90 enables the locking completion signal lock.

When the locking completion signal lock is disabled, the switching unit 120 transmits the first fine control signal fincnt1 to the second delay control unit 140. Accordingly, the first delay control unit 130 and the second delay control unit 140 control the operations of the first delay unit 20 and the second delay unit 30 in response to the coarse control signal crscnt and the first fine control signal fincnt1, respectively. The first delay unit 20 and the second delay unit 30 receives the positive reference clock clk_ref and the negative reference clock /clk_ref, and generate the first delay clock clk_dly1 and the second delay clock clk_dly2 in response to the coarse control signal crscnt and the first fine control signal fincnt1, respectively. At this time, in the first delay unit 20 and the second delay unit 30, the same number of delay units is provided. Therefore, if a pair of external clocks clk_ext and /clk_ext does not have the duty ratio of 50:50 (for example, the high-level period of the clock is wider than the low-level period of the clock), and different delay times are applied to the positive reference clock clk_ref and the negative reference clock /clk_ref due to a change in PVT of the DLL circuit, the first delay clock clk_dly1 and the second delay clock clk_dly2 have phases opposite to each other but do not have the duty ratio of 50:50.

This is corrected by the duty ratio correction unit 40. The operation of the duty ratio correction unit 40 that corrects the duty ratios of the first delay clock clk_dly1 and the second delay clock clk_dly2 refers to an operation that separately delays the first delay clock clk_dly1 and the second delay clock clk_dly2. This will be described below in detail with reference to FIG. 2 to FIG. 5.

The first correction clock clk_crt1 output from the duty ratio correction unit 40 is driven by the first clock driver 50 and output as the rising clock rclk. Simultaneously, the second correction clock clk_crt2 is driven by the second clock driver 60 and output as the falling clock fclk having a phase opposite to the rising clock rclk.

The delay modeling unit 70 delays the first correction clock clk_crt1 for a prescribed time and transmits the delayed clock to the phase comparison unit 80 as the feedback clock clk_fb. The phase comparison unit 80 compares the phase of the reference clock clk_ref with the phase of the feedback clock clk_fb, and controls the level of the phase comparison signal phcmp according to the comparison result. The operation mode setting unit 90 controls enabling/disabling of the locking completion signal lock, the coarse mode signal crsmd, and the first fine control signal fincnt1 in response to the phase comparison signal phcmp.

Meanwhile, when the locking completion signal lock is enabled, the switching unit 120 transmits the second fine control signal fincnt2 to the second delay control unit 140. Accordingly, the first delay control unit 130 controls the operation of the first delay unit 20 in response to the coarse control signal crscnt and the first fine control signal fincnt1. The second delay control unit 140 controls the operation of the second delay unit 30 in response to the coarse control signal crscnt and the second fine control signal fincnt2.

Subsequently, the first delay unit 20 receives the positive reference clock clk_ref, and generates the first delay clock clk_dly1 in response to the first delay control signal dlycont1 transmitted from the first delay control unit 130. The second delay unit 30 receives the negative reference clock /clk_ref, and generates the second delay clock clk_dly2 in response to the second delay control signal dlycont2 transmitted from the second delay control unit 140. Accordingly, different delay times are applied to the first delay clock clk_dly1 and the second delay clock clk_dly2. Next, the duty ratio correction unit 40 corrects the duty ratios of the first delay clock clk_dly1 and the second delay clock clk_dly2, and generates the first and second correction clocks clk_crt1 and clk_crt2.

Next, the first and second correction clocks clk_crt1 and clk_crt2 are transmitted to the duty ratio detection unit 100. The duty ratio detection unit 100 increases the level of the first detection signal det1 above the level of the second detection signal det2 if a high-level period of the first correction clock clk_crt1 is wider than a low-level period thereof, and a high-level period of the second correction clock clk_crt2 is narrower than a low-level period thereof. In contrast, if the high-level period of the first correction clock clk_crt1 is narrower than the low-level period thereof, and the high-level period of the second correction clock clk_crt2 is wider than the low-level period thereof, the duty ratio detection unit 100 decreases the level of the first detection signal det1 below the level of the second detection signal det2.

The voltage comparison unit 110 may be implemented by a comparator composed of a general differential amplifier. If the level of the first detection signal det1 is higher than the level of the second detection signal det2, the voltage comparison unit 110 disables the second fine control signal fincnt2. Further, if the level of the first detection signal det1 is lower than the level of the second detection signal det2, the voltage comparison unit 110 enables the second fine control signal fincnt2.

The second fine control signal fincnt2 is transmitted to the second delay control unit 140. Next, the second delay unit 30 receives information on the duty ratios of the first and second correction clocks clk_crt1 and clk_crt2 through the second delay control signal dlycont2 and performs a corresponding delay operation. That is, if the high-level period of the first correction clock clk_crt1 is wider than the low-level period thereof, and the high-level period of the second correction clock clk_crt2 is narrower than the low-level period thereof, the second delay unit 30 decreases the delay time to be applied to the reference clock clk_ref and allows the phase of the second delay clock clk_dly2 to be earlier. In contrast, if the low-level period of the first correction clock clk_crt1 is wider than the high-level period thereof, and the low-level period of the second correction clock clk_crt2 is narrower than the high-level period thereof, the second delay unit 30 increases the delay time to be applied to the reference clock clk_ref and allows the phase of the second delay clock clk_dly2 to be later.

Figure 2:
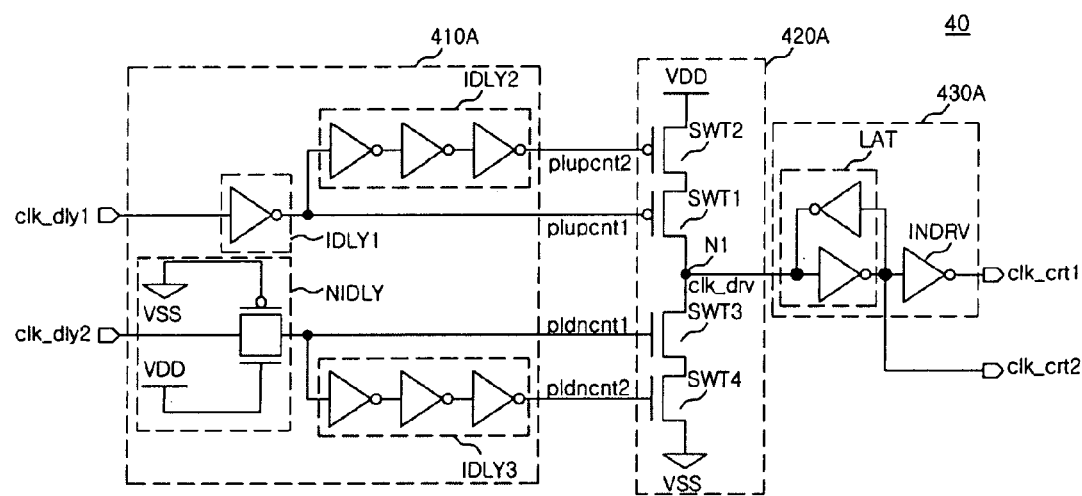
FIG. 2 is a diagram illustrating a first example of a detailed configuration of a duty ratio correction unit shown in FIG. 1.
Figure 3:
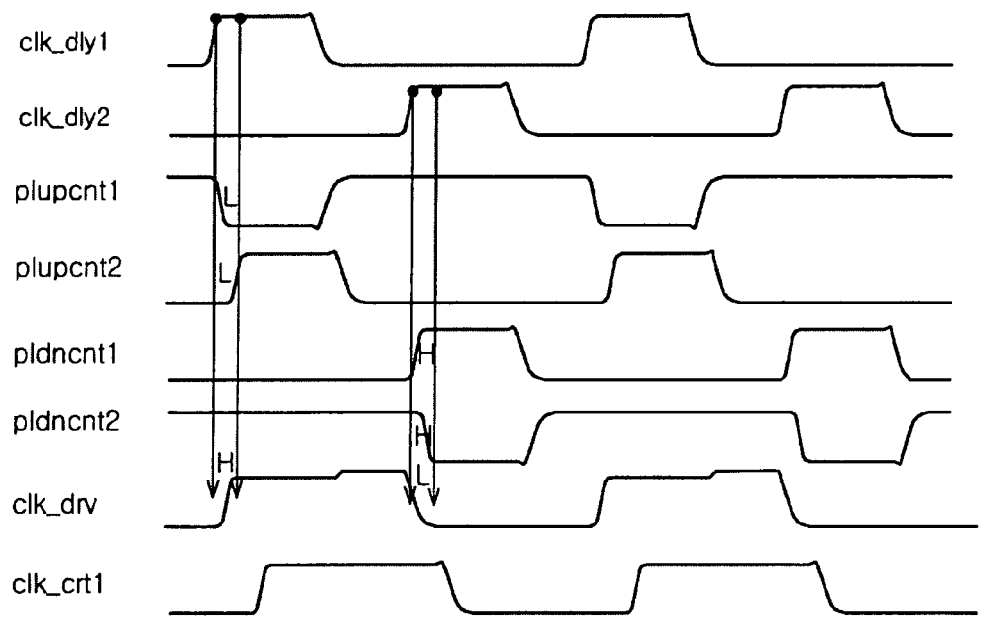
FIG. 3 is a timing chart illustrating an operation of the duty ratio correction unit shown in FIG. 2.

FIG. 2 is a diagram illustrating a first example of a detailed configuration of a duty ratio correction unit shown in FIG. 1. FIG. 3 is a timing chart illustrating an operation of the duty ratio correction unit shown in FIG. 2. Referring to FIG. 3, in the first delay clock clk_dly1 and the second delay clock clk_dly2, the high-level period is narrower, and the low-level period is wider.

The duty ratio correction unit 40 includes a delay unit 410A, a driving unit 420A, and a latch unit 430A.

The delay unit 410A separately delays the first delay clock clk_dly1 and the second delay clock clk_dly2, thereby outputting first and second pull-up control signals plupcnt1 and plupcnt2 and first and second pull-down control signals pldncnt1 and pldncnt2.

The driving unit 420A drives a power supply voltage in response to the first and second pull-up control signals plupcnt1 and plupcnt2 and the first and second pull-down control signals pldncnt1 and pldncnt2 to generate a driving clock clk_drv.

The latch unit 430A latches and drives the driving clock clk_drv to generate the first and second correction clocks clk_crt1 and clk_crt2.

The delay unit 410A includes a first invert delay unit IDLY1, a second invert delay unit IDLY2, a non-invert delay unit NIDLY, and a third invert delay unit IDLY3.

The first invert delay unit IDLY1 receives the first delay clock clk_dly1 and outputs the first pull-up control signal plupcnt1.

The second invert delay unit IDLY2 receives the first pull-up control signal plupcnt1 and outputs the second pull-up control signal plupcnt2.

The non-invert delay unit NIDLY receives the second delay clock clk_dly2 and outputs the first pull-down control signal pldncnt1.

The third invert delay unit IDLY3 receives the first pull-down control signal pldncnt1 and outputs the second pull-down control signal pldncnt2.

The first invert delay unit IDLY1 and the non-invert delay unit NIDLY have the same delay amount with respect to each of input clocks. The first invert delay unit IDLY1 may be implemented by a single inverter and the non-invert delay unit NIDLY may be implemented by a turned-on pass gate. Further, each of the second invert delay unit IDLY2 and the third invert delay unit IDLY3 may be implemented by an odd number of inverters connected in series. The number of inverters in each of the second invert delay unit IDLY2 and the third invert delay unit IDLY3 can be determined by a design test.

The driving unit 420A includes a first switch SWT1, a second switch SWT2, a third switch SWT3, and a fourth switch SWT4.

The first switch SWT1 is coupled with a first node N1 and is turned on in response to the first pull-up control signal plupcnt1.

The second switch SWT2 is provided between a supply terminal of an external power supply voltage VDD and the first switch SWT1, and is turned on in response to the second pull-up control signal plupcnt2.

The third switch SWT3 is coupled with the first node N1 and is turned on in response to the first pull-down control signal pldncnt1.

The fourth switch SWT4 is provided between a supply terminal of a ground power supply voltage VSS and the third switch SWT3, and is turned on in response to the second pull-down control signal pldncnt2.

Each of the first and second switches SWT1 and SWT2 may be implemented by a PMOS transistor, and each of the third and fourth switches SWT3 and SWT4 may be implemented by a NMOS transistor. The clock signal that is formed at the first node N1 by the switching operations of the first to fourth switches SWT1 to SWT4 is the driving clock clk_drv.

The latch unit 430A includes a latch LAT and an invert driver INDRV.

The latch LAT latches the driving clock clk_drv and outputs the second correction clock clk_crt2. The latch LAT may be implemented by two inverters having a latch structure.

The invert driver INDRV inverts the second correction clock clk_crt2, thereby outputting the first correction clock clk_crt1. The invert driver INDRV may be implemented by a single inverter.

FIG. 3 shows the timing of the first pull-up control signal plupcnt1 and the second pull-up control signal plupcnt2 inverted and delayed from the first delay clock clk_dly1. The driving clock clk_drv has a rising edge when the first pull-up control signal plupcnt1 and the second pull-up control signal plupcnt2 are all at the low-level.

FIG. 3 also shows the timing of the first pull-down control signal pldncnt1 and the second pull-down control signal pldncnt2 non-inverted and delayed from the second delay clock clk_dly2. The driving clock clk_drv has a falling edge when the first pull-down control signal pldncnt1 and the second pull-down control signal pldncnt2 are all at the high-level.

The first correction clock clk_crt1 has a form non-inverted and delayed from the driving clock clk_drv. It will be apparent to those skilled in the art that the second correction clock clk_crt2 has a phase opposite to the first correction clock clk_crt1, and thus it is not shown in FIG. 3.

When the high-level periods of the first and second delay clocks clk_dly1 and clk_dly2 are narrower than the low-level periods thereof, the duty ratio detection unit 100 decreases the level of the first detection signal det1 below the level of the second detection signal det2. Subsequently, the voltage comparison unit 110 enables the second fine control signal fincnt2. Then, the second delay unit 30 increases the delay time to be applied to the positive reference clock clk_ref to allow the phase of the second delay clock clk_dly2 to be later.

Meanwhile, when the high-level periods of the first and second delay clocks clk_dly1 and clk_dly2 are wider than the low-level periods thereof, the duty ratio detection unit 100 increase the level of the first detection signal det1 above the level of the second detection signal det2. Subsequently, the voltage comparison unit 110 disables the second fine control signal fincnt2. Then, the second delay unit 30 decreases the delay time to be applied to the reference clock clk_ref to allow the phase of the second delay clock clk_dly2 to be earlier. As such, after the delay locking operation of the DLL circuit is completed, the first and second correction clocks clk_crt1 and clk_crt2 having the corrected duty ratios are generated through the second feedback loop 2.

Figure 4:
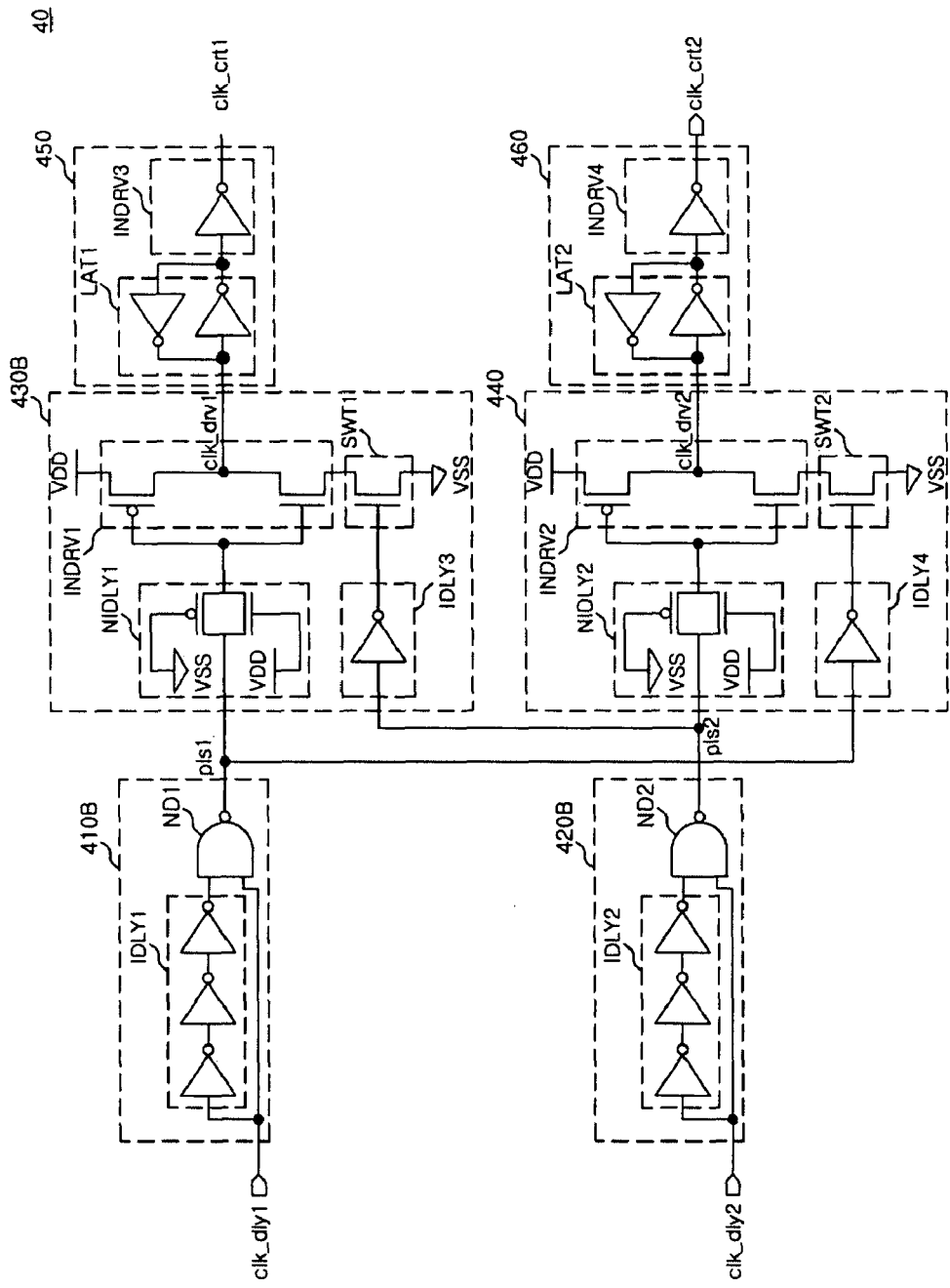
FIG. 4 is a diagram illustrating a second example of a detailed configuration of a duty ratio correction unit shown in FIG. 1.
Figure 5:
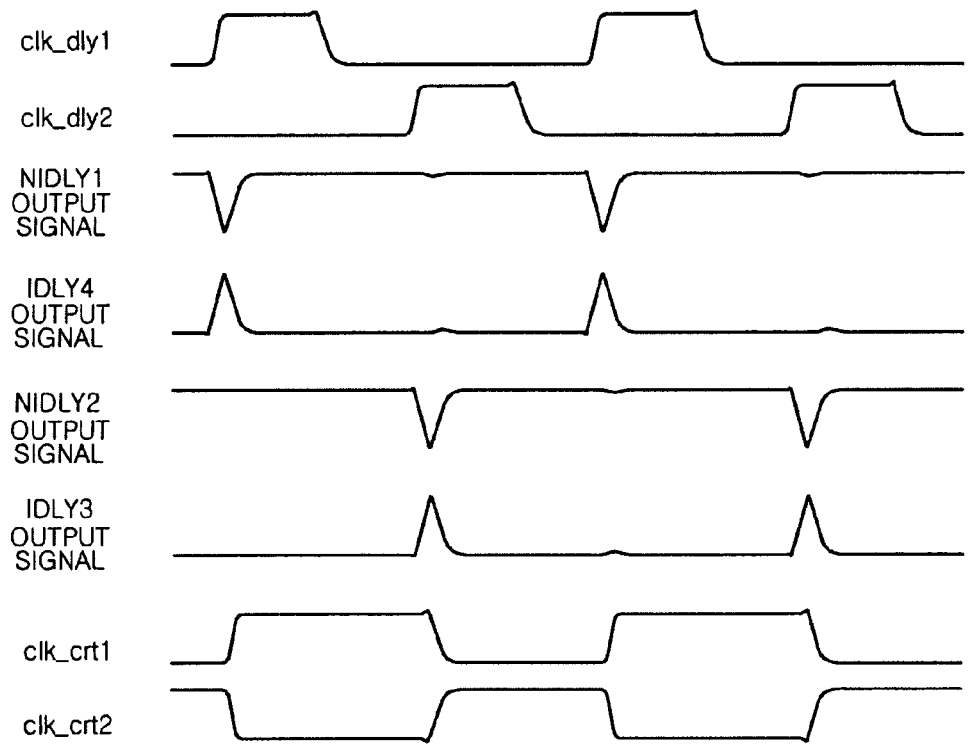
FIG. 5 is a timing chart illustrating an operation of the duty ratio correction unit shown in FIG. 4.

FIG. 4 is a diagram illustrating a second example of a detailed configuration of the duty ratio correction unit shown in FIG. 1. FIG. 5 is a timing chart illustrating an operation of the duty ratio correction unit shown in FIG. 4. Similarly, FIG. 5 shows a case where, in the first delay clock clk_dly1 and the second delay clock clk_dly2, the high-level period is narrower and the low-level period is wider.

The duty ratio correction unit 40 includes a first pulse generator 410B, a second pulse generator 420B, a first driving unit 430B, a second driving unit 440, a first latch unit 450, and a second latch unit 460.

The first pulse generator 410B generates a first pulse signal pls1 from the first delay clock clk_dly1.

The second pulse generator 420B generates a second pulse signal pls2 from the second delay clock clk_dly2.

The first driving unit 430B drives the first pulse signal pls1 in response to the second pulse signal pls2 to generate a first driving clock clk_drv1.

The second driving unit 440 drives the second pulse signal pls2 in response to the first pulse signal pls1 to generate a second driving clock clk_drv2.

The first latch unit 450 latches and drives the first driving clock clk_drv1 to output the first correction clock clk_crt1.

The second latch unit 460 latches and drives the second driving clock clk_drv2 to output the second correction clock clk_crt2.

The first pulse generator 410B includes a first invert delay unit IDLY1 and a first NAND gate ND1.

The first invert delay unit IDLY1 receives the first delay clock clk_dly1.

The first NAND gate ND1 receives the first delay clock clk_dly1 and an output signal of the first invert delay unit IDLY1, and outputs the first pulse signal pls1.

The second pulse generator 420B includes a second invert delay unit IDLY2 and a second NAND gate ND2.

The second invert delay unit IDLY2 receives the second delay clock clk_dly2.

The second NAND gate ND2 receives the second delay clock clk_dly2 and an output signal of the second invert delay unit IDLY2, and outputs the second pulse signal pls2.

The first invert delay unit IDLY1 and the second invert delay unit IDLY2 may be implemented by an odd number of inverters connected in series. The number of inverters is determined by a design test.

The first driving unit 430B includes a first non-invert delay unit NIDLY1, a third invert delay unit IDLY3, a first invert driver INDRV1, and a first switch SWT1.

The first non-invert delay unit NIDLY1 receives the first pulse signal pls1.

The third invert delay unit IDLY3 receives the second pulse signal pls2.

The first invert driver INDRV1 receives an output signal of the first non-invert delay unit NIDLY1.

The first switch SWT1 is provided between the first invert driver INDRV1 and a ground terminal, and is turned on in response to an output signal of the third invert delay unit IDLY3.

The second driving unit 440 includes a second non-invert delay unit NIDLY2, a fourth invert delay unit IDLY4, a second invert driver INDRV2, and a second switch SWT2.

The second non-invert delay unit NIDLY2 receives the second pulse signal pls2.

The fourth invert delay unit IDLY4 receives the first pulse signal pls1.

The second invert driver INDRV2 receives an output signal of the second non-invert delay unit NIDLY2.

The second switch SWT2 is provided between the second invert driver INDRV2 and the ground terminal, and is turned on in response to an output signal of the fourth invert delay unit IDLY4.

Each of the first non-invert delay unit NIDLY1 and the second non-invert delay unit NIDLY2 may be implemented by a single pass gate. Further, each of the third invert delay unit IDLY3, the first invert driver INDRV1, the fourth invert delay unit IDLY4, and the second invert driver INDRV2 may be implemented by a single inverter. In addition, each of the first switch SWT1 and the second switch SWT2 may be implemented by an NMOS transistor.

The first latch unit 450 includes a first latch LAT1 and a third invert driver INDRV3.

The first latch LAT1 latches an output signal of the first driving unit 430.

The third invert driver INDRV3 inverts an output signal of the first latch LAT1 to output the first correction clock clk_crt1.

The second latch unit 460 includes a second latch LAT2 and a fourth invert driver INDRV4.

The second latch LAT2 latches an output signal of the second driving unit 440.

The fourth invert driver INDRV4 inverts an output signal of the second latch LAT2 to output the second correction clock clk_crt2.

Each of the first latch LAT1 and the second latch LAT2 may be implemented by two inverters having a latch structure. Further, each of the third invert driver INDRV3 and the fourth invert driver INDRV4 may be implemented by a single inverter.

Referring to FIG. 5, the output signal of the first non-invert delay unit NIDLY1 in the first driving unit 430B is toggled to a low level at a rising edge of the first delay clock clk_dly1. The output signal of the fourth invert delay unit IDLY4 in the second driving unit 440 has a phase opposite thereto. The output signal of the third invert delay unit IDLY3 in the first driving unit 430B is toggled to a high level at a rising edge of the second delay clock clk_dly2. The output signal of the second non-invert delay unit NIDLY2 in the second driving unit 440 has a phase opposite thereto.

The first correction clock clk_crt1 rises if the output signal of the first non-invert delay unit NIDLY1 is changed to a low level. Subsequently, even though the output signal of the first non-invert delay unit NIDLY1 is changed to a high level again, the first correction clock clk_crt1 maintains a high level. Then, and the first correction clock clk_crt1 falls if the output signal of the third invert delay unit IDLY3 is changed to a high level.

The second correction clock clk_crt2 rises if the output signal of the second non-invert delay unit NIDLY2 is changed to a low level. Subsequently, even though the output signal of the second non-invert delay unit NIDLY2 is changed to a high level again, the second correction clock clk_crt2 maintains a high level. Then, the second correction clock clk_crt2 falls if the output signal of the fourth invert delay unit IDLY4 is changed to a high level.

When the high-level periods of the first and second delay clocks clk_dly1 and clk_dly2 are narrower than the low-level periods thereof, the duty ratio detection unit 100 decreases the level of the first detection signal det1 below the level of the second detection signal det2. Subsequently, the voltage comparison unit 110 enables the second fine control signal fincnt2. Then, the second delay unit 30 increases the delay time to be applied to the reference clock clk_ref to allow the phase of the second delay clock clk_dly2 to be later.

Meanwhile, when the high-level periods of the first and second delay clocks clk_dly1 and clk_dly2 are wider than the low-level periods thereof, the duty ratio detection unit 100 increases the level of the first detection signal det1 above the level of the second detection signal det2. Subsequently, the voltage comparison unit 110 disables the second fine control signal fincnt2. Then, the second delay unit 30 decreases the delay time to be applied to the reference clock clk_ref to allow the phase of the second delay clock clk_dly2 to be earlier. As such, after the delay locking operation of the DLL circuit is completed, the first and second correction clocks clk_crt1 and clk_crt2 having the corrected the duty ratios are generated through the second feedback loop 2.

Figure 6:
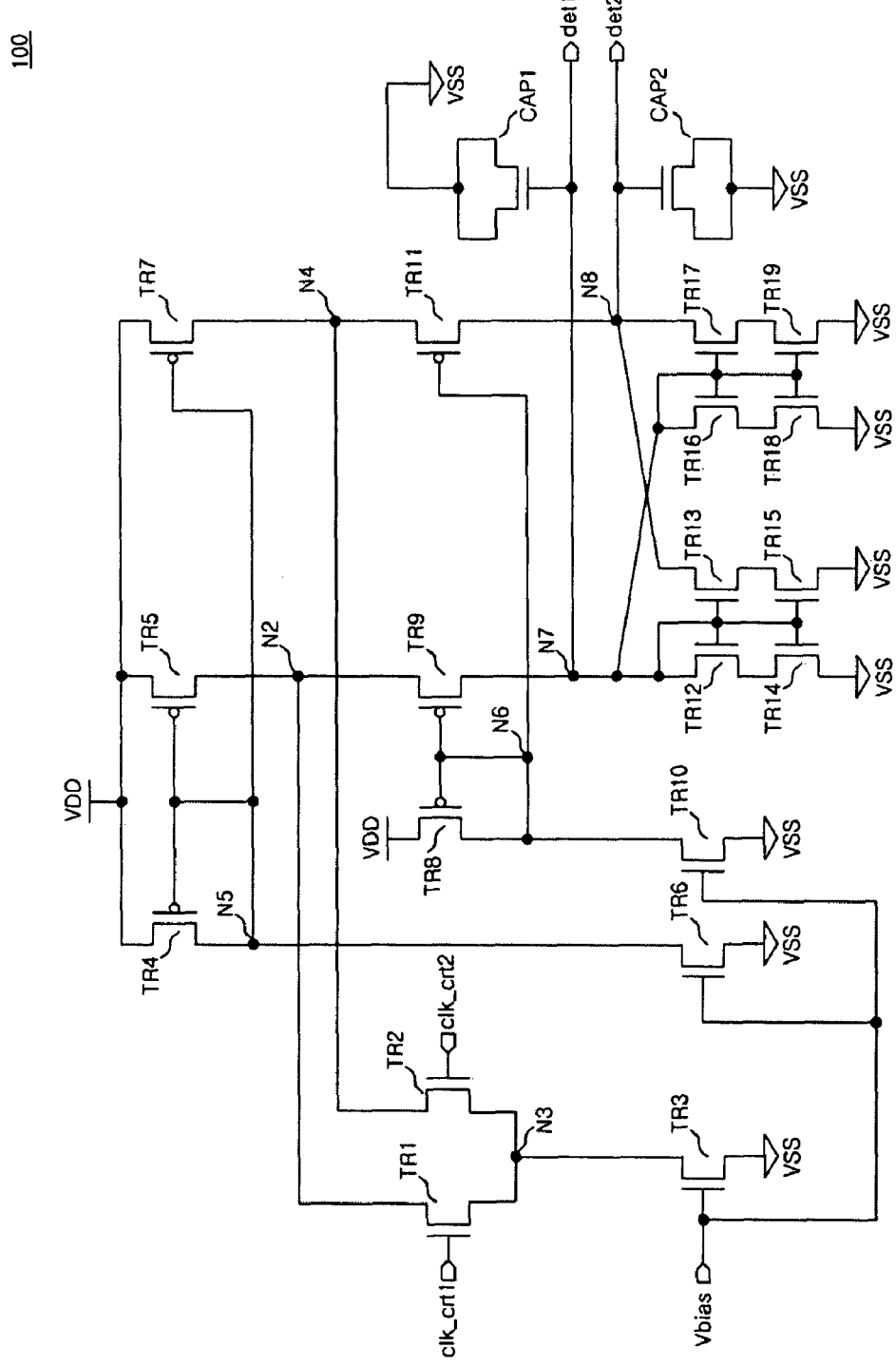
FIG. 6 is a diagram illustrating a detailed configuration of a duty ratio detection unit shown in FIG. 1.

Referring FIG. 6, the duty ratio detection unit 100 includes first to nineteenth transistors TR1 to TR19, and first and second capacitors CAP1 and CAP2.

The first transistor TR1 has a gate terminal receiving the first correction clock clk_crt1, a drain terminal coupled with a second node N2, and a source terminal coupled with a third node N3.

The second transistor TR2 has a gate terminal receiving the second correction clock clk_crt2, a drain terminal coupled with a fourth node N4, and a source terminal coupled with the third node N3.

The third transistor TR3 has a gate terminal applied with a bias voltage Vbias, a drain terminal coupled with the third node N3, and a source terminal coupled with the ground terminal.

The fourth transistor TR4 has a gate terminal and a drain terminal coupled with a fifth node N5, and a source terminal applied with the external power supply VDD.

The fifth transistor TR5 has a gate terminal coupled with the fifth node N5, a source terminal applied to the external power supply VDD, and a drain terminal coupled with the second node N2.

The sixth transistor TR6 has a gate terminal applied to the bias voltage Vbias, a drain terminal coupled with the fifth node N5, and a source terminal coupled with the ground terminal.

The seventh transistor TR7 has a gate terminal coupled with the fifth node N5, a source terminal applied to the external power supply VDD, and a drain terminal coupled with the fourth node N4.

The eighth transistor TR8 has a gate terminal and a drain terminal coupled with a sixth node N6, and a source terminal applied to the external power supply VDD.

The ninth transistor TR9 has a gate terminal coupled with the sixth node N6, a source terminal coupled with the second node N2, and a drain terminal coupled with a seventh node N7.

The tenth transistor TR10 has a gate terminal applied with the bias voltage Vbias, a drain terminal coupled with the sixth node N6, and a source terminal coupled with the ground terminal.

The eleventh transistor TR11 has a gate terminal coupled with the sixth node N6, a source terminal coupled with the fourth node N4, and a drain terminal coupled with an eighth node N8.

The twelfth transistor TR12 has a gate terminal and a drain terminal coupled with the seventh node N7.

The thirteenth transistor TR13 has a gate terminal coupled with the seventh node N7 and a drain terminal coupled with the eighth node N8.

The fourteenth transistor TR14 has a gate terminal coupled with the seventh node N7, a drain terminal coupled with a source terminal of the twelfth transistor TR12, and a source terminal coupled with the ground terminal.

The fifteenth transistor TR15 has a gate terminal coupled with the seventh node N7, a drain terminal coupled with a source terminal of the thirteenth transistor TR13, and a source terminal coupled with the ground terminal.

The sixteenth transistor TR16 has a gate terminal and a drain terminal coupled with the seventh node N7.

The seventeenth transistor TR17 has a gate terminal coupled with the seventh node N7 and a drain terminal coupled with the eighth node N8.

The eighteenth transistor TR18 has a gate terminal coupled with the seventh node N7, a drain terminal coupled with a source terminal of the sixteenth transistor TR16, and a source terminal coupled with the ground terminal.

The nineteenth transistor TR19 has a gate terminal coupled with the seventh node N7, a drain terminal coupled with a source terminal of the seventeenth transistor TR17, and a source terminal coupled with the ground terminal.

The first capacitor CAP1 is provided between the seventh node N7 and the ground terminal.

The second capacitor CAP2 is provided between the eighth node N8 and the ground terminal.

The first detection signal det1 is output from the seventh node N7, and the second detection signal det2 is output from the eighth node N8.

Figure 7:
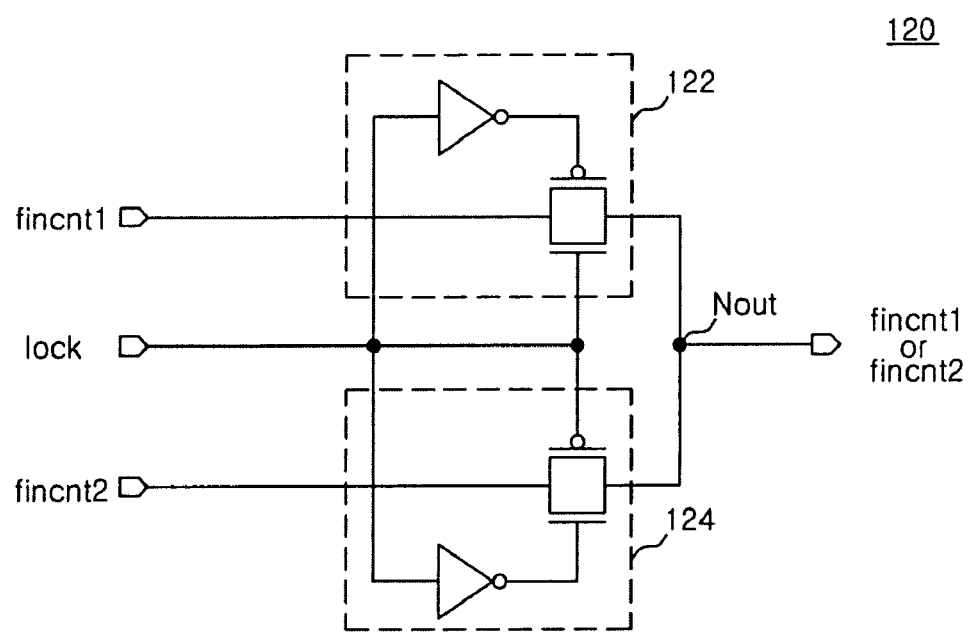
FIG. 7 is a diagram illustrating a detailed configuration of a switching unit shown in FIG. 1.

Referring to FIG. 7, the switching unit 120 includes a first switching unit 122 and a second switching unit 124.

The first switching unit 122 transmits the first fine control signal fincnt1 to an output node Nout if the locking completion signal lock is disabled.

The second switching unit 124 transmits the second fine control signal fincnt2 to the output node Nout if the locking completion signal lock is enabled.

The first switching unit 122 and the second switching unit 124 may be implemented by pass gates having control terminals receiving the locking completion signal lock and an inverted locking completion signal lock, respectively.

The switching unit 120 transmits the first fine control signal fincnt1 to the second delay control unit 140 when the locking completion signal lock is disabled, and causes the second delay unit 30 to generate the second delay clock clk_dly2 from the reference clock clk_ref by linked with the first delay unit 20. Further, the switching unit 120 transmits the second fine control signal fincnt2 to the second delay control unit 140 when the locking completion signal lock is enabled, and causes the second delay unit 30 to delay the negative reference clock /clk_ref and to generate the second delay clock clk_dly2 in order to control the duty ratios of the first and second correction clocks clk_crt1 and clk_crt2.

That is, when the delay locking operation is in progress, the DLL circuit performs a general delay locking operation of a clock using the first feedback loop 1 and the second feedback loop 2. If the delay locking operation is completed, the DLL circuit performs an operation to correct the duty ratio of the output clock using the second feedback loop 2 while performing a general operation using the first feedback loop 1.

Accordingly, the DLL circuit according to an embodiment of the present invention can perform the continuous duty ratio correction operation after the delay locking operation of the clock is completed. Therefore, an output clock having an improved duty ratio quality can be generated compared with a DLL circuit according to the related art having a phase mixer.

Further, even though the duty ratio of the clock is changed due to a change in PVT, this change is continuously corrected by a feedback loop, thereby meeting the change in PVT. In addition, a small area is required compared with the related art, and thus an area margin increases. Accordingly, power consumption is reduced.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

According to the DLL circuit and the method of controlling the same of embodiments of the present invention, a clock having an improved duty ratio quality is output.

According to the DLL circuit and the method of controlling the same of embodiments of the present invention, a clock whose duty ratio does not change due to a change in PVT is output.

According to the DLL circuit and the method of controlling the same of embodiments of the present invention, an area margin increases and power consumption is reduced. As a result, low power consumption and high integration of a semiconductor integrated circuit can be realized.

What is claimed is:

1. A DLL (Delay Locked Loop) circuit comprising:
   a duty ratio correction unit configured to correct duty ratios of first and second delay clocks to generate first and second correction clocks;
   a duty ratio detection unit configured to detect duty ratios of the first and second correction clocks, thereby generating first and second detection signals;
   a voltage comparison unit configured to compare levels of the first and second detection signals, thereby generating a first fine control signal;
   an operation mode setting unit configured to generate a locking completion signal and a second fine control signal; and
   a switching unit configured to transmit one of the first fine control signal and the second fine control signal to a delay control unit according to whether or not the locking completion signal is enabled, wherein the first clock is generated from a first delay line which receives a first reference clock and is controlled by the first fine control signal to delay the first reference clock, and the second clock is generated from a second delay line which receives a second reference clock and is controlled by output of the switching unit to delay the second reference clock.

2. The DLL circuit of claim 1,
   wherein the duty ratio correction unit is configured to separately delay the first and second delay clocks to obtain separately delayed clocks, and to generate the first and second correction clocks using a difference in toggle timing between the separately delayed clocks.

3. The DLL circuit of claim 1,
   wherein the duty ratio correction unit comprises:
   a delay unit configured to separately delay the first delay clock and the second delay clock to generate first and second pull-up control signals and first and second pull-down control signals;
   a driving unit configured to drive a power supply voltage in response to the first and second pull-up control signals and the first and second pull-down control signals to generate a driving clock; and
   a latch unit configured to latch and to drive the driving clock to generate the first and second correction clocks.

4. The DLL circuit of claim 3,
   wherein the delay unit comprises:
   a first invert delay unit configured to receive the first delay clock and to output the first pull-up control signal;
   a second invert delay unit configured to receive the first pull-up control signal and to output the second pull-up control signal;

a non-invert delay unit configured to receive the second delay clock and to output the first pull-down control signal; and a third invert delay unit configured to receive the first pull-down control signal and to output the second pull-down control signal.

5. The DLL circuit of claim 3,
wherein the driving unit includes:
a first switch that is coupled with a first node and is turned on in response to the first pull-up control signal;
a second switch that is provided between a supply terminal of an external power supply voltage and the first switch, and is turned on in response to the second pull-up control signal;
a third switch that is coupled with the first node and is turned on in response to the first pull-down control signal; and
a fourth switch that is provided between a supply terminal of a ground power supply voltage and the third switch, and is turned on in response to the second pull-down control signal.

6. The DLL circuit of claim 3,
wherein the latch unit comprises:
a latch configured to latch the driving clock and to output the second correction clock; and
an invert driver configured to invert the second correction clock to output the first correction clock.

7. The DLL circuit of claim 1,
wherein the duty ratio correction unit is configured to generate pulse signals from the first and second delay clocks, and to generate the first and second correction clocks using toggle timing of individual pulse signals.

8. The DLL circuit of claim 1,
wherein the duty ratio correction unit comprises:
a first pulse generator configured to generate a first pulse signal from the first delay clock;
a second pulse generator configured to generate a second pulse signal from the second delay clock;
a first driving unit configured to drive the first pulse signal in response to the second pulse signal to generate a first driving clock;
a second driving unit configured to drive the second pulse signal in response to the first pulse signal to generate a second driving clock;
a first latch unit configured to latch and to drive the first driving clock to output the first correction clock; and
a second latch unit configured to latch and to drive the second driving clock to output the second correction clock.

9. The DLL circuit of claim 8,
wherein the first driving unit comprises:
a non-invert delay unit configured to receive the first pulse signal to provide an output signal;
an invert delay unit configured to receive the second pulse signal to provide an output signal;
an invert driver configured to receive the output signal of the non-invert delay unit; and
a first switch that is provided between the invert driver and a ground terminal, and is turned on in response of the output signal of the invert delay unit.

10. The DLL circuit of claim 8,
wherein the second driving unit comprises:
a non-invert delay unit configured to receive the second pulse signal to provide an output signal;
an invert delay unit configured to receive the first pulse signal to provide an output signal;

an invert driver configured to receive the output signal of the non-invert delay unit; and
a second switch that is provided between the invert driver and a ground terminal, and is turned on in response to the output signal of the invert delay unit.

11. The DLL circuit of claim 1,
wherein the duty ratio detection unit is configured to increase the level of the first detection signal above the level of the second detection signal if a high-level period of the first correction clock is wider than a low-level period thereof, and a high-level period of the second correction clock is narrower than a low-level period thereof, and to decrease the level of the first detection signal below the level of the second detection signal if the high-level period of the first correction clock is narrower than the low-level period thereof, and the high-level period of the second correction clock is wider than the low-level period thereof.

12. The DLL circuit of claim 1,
wherein the voltage comparison unit is configured to disable the first fine control signal when the level of the first detection signal is higher than the level of the second detection signal, and to enable the first fine control signal when the level of the first detection signal is lower than the level of the second detection signal.

13. The DLL circuit of claim 1,
wherein the switching unit comprises:
a first switching unit configured to transmit the first fine control signal to the delay control unit when the locking completion signal is disabled; and
a second switching unit configured to transmit the second fine control signal to the delay control unit when the locking completion signal is enabled.

14. A DLL circuit comprising:
a first feedback loop configured to receive a reference clock from a clock input buffer and to output a first clock, wherein the first feedback loop comprises a first delay unit to receive the reference clock, and a delay time of the first delay line is fixed when a delay locking operation is completed; and
a second feedback loop configured to receive the reference clock from the clock input buffer, when the delay locking operation is in progress, to generate a second clock by linking with an operation to generate the first clock, and, when the delay locking operation is completed, to correct duty ratios of the first and second clocks, wherein the second feedback loop comprises a second delay unit to receive the reference clock, and a delay time of the second delay line is changed based on the duty detection results between the first and second clocks.

15. The DLL circuit of claim 14,
wherein the first feedback loop is configured to receive the reference clock, to perform modeling of a delay time of the reference clock to a data output buffer to generate a feedback clock, to generate the first clock through phase comparison with the reference clock, and, when the delay locking operation is completed, to apply a fixed delay time to the reference clock.

16. The DLL circuit of claim 14,
wherein the first feedback loop comprises:
the first delay unit configured to delay the reference clock in response to a first delay control signal, thereby outputting a first delay clock;
a duty ratio correction unit configured to correct a duty ratio of the first delay clock to generate the first clock;
a delay modeling unit configured to delay the first clock for a predetermined time, thereby generating a feedback clock in order to perform modeling of a delay amount until the first clock is transmitted to a data output buffer;

a phase comparison unit configured to compare a phase of the reference clock with a phase of the feedback clock, thereby generating a phase comparison signal;

an operation mode setting unit configured to output a locking completion signal, a coarse control signal, and a first fine control signal in response to the phase comparison signal; and a first delay control unit configured to generate the first delay control signal in response to the locking completion signal, the coarse control signal, and the first fine control signal.

17. The DLL circuit of claim 16,
wherein the second feedback loop comprises:
the second delay unit configured to delay the reference clock in response to a second delay control signal, thereby outputting a second delay clock;
a duty ratio correction unit configured to correct a duty ratio of the second delay clock, thereby generating the second clock;
a duty ratio detection unit configured to detect duty ratios of the first and second clocks, thereby generating first and second detection signals;
a voltage comparison unit configured to compare levels of the first and second detection signals, thereby generating a second fine control signal;
a switching unit configured to output one of the first fine control signal and the second fine control signal according to whether or not the locking completion signal is enabled; and
a second delay control unit configured to generate the second delay control signal in response to the locking completion signal, the coarse control signal, and the first fine control signal or the second fine control signal.

18. The DLL circuit of claim 17,
wherein the duty ratio correction unit is configured to separately delay the first and second delay clocks to obtain separately delayed clocks, and to generate the first and second clocks using a difference in toggle timing between the separately delayed clocks.

19. The DLL circuit of claim 18,
wherein the duty ratio correction unit comprises:
a delay unit configured to separately delay the first delay clock and the second delay clock, thereby outputting first and second pull-up control signals and first and second pull-down control signals;
a driving unit configured to drive a power supply in response to the first and second pull-up control signals and the first and second pull-down control signals to generate a driving clock; and
a latch unit configured to latch and to drive the driving clock to generate the first and second clocks.

20. The DLL circuit of claim 19,
wherein the delay unit comprises:
a first invert delay unit configured to receive the first delay clock and to output the first pull-up control signal;
a second invert delay unit configured to receive the first pull-up control signal and to output the second pull-up control signal;
a non-invert delay unit configured to receive the second delay clock and to output the first pull-down control signal; and
a third invert delay unit configured to receive the first pull-down control signal and to output the second pull-down control signal.

21. The DLL circuit of claim 19,
wherein the driving unit comprises:
a first switch that is coupled with a first node and is turned on in response to the first pull-up control signal;
a second switch that is provided between a supply terminal of an external power supply voltage and the first switch, and is turned on in response to the second pull-up control signal;
a third switch that is coupled with the first node and is turned on in response to the first pull-down control signal; and
a fourth switch that is provided between a supply terminal of a ground power supply voltage and the third switch, and is turned on in response to the second pull-down control signal.

22. The DLL circuit of claim 19,
wherein the latch unit comprises:
a latch configured to latch the driving clock and to output the second clock; and
an invert driver configured to invert the second clock to output the first clock.

23. The DLL circuit of claim 17,
wherein the duty ratio correction unit is configured to generate pulse signals from the first and second delay clocks, and to generate the first and second clocks using the toggle timing of individual pulse signals.

24. The DLL circuit of claim 17,
wherein the duty ratio correction unit comprises:
a first pulse generator configured to generate a first pulse signal from the first delay clock;
a second pulse generator configured to generate a second pulse signal from the second delay clock;
a first driving unit configured to drive the first pulse signal in response to the second pulse signal to generate a first driving clock;
a second driving unit configured to drive the second pulse signal in response to the first pulse signal to generate a second driving clock;
a first latch unit configured to latch and to drive the first driving clock to output the first clock; and
a second latch unit configured to latch and to drive the second driving clock to output the second clock.

25. The DLL circuit of claim 24,
wherein the first driving unit comprises
a non-invert delay unit configured to receive the first pulse signal to provide an output signal;
an invert delay unit configured to receive the second pulse signal to provide an output signal;
an invert driver configured to receive the output signal of the non-invert delay unit; and
a first switch that is provided between the invert driver and a ground terminal, and is turned on in response to the output signal of the invert delay unit.

26. The DLL circuit of claim 24,
wherein the second driving unit comprises:
a non-invert delay unit configured to receive the second pulse signal to provide an output signal;
an invert delay unit configured to receive the first pulse signal to provide an output signal;
an invert driver configured to receive the output signal of the non-invert delay unit; and
a second switch that is provided between the invert driver and a ground terminal, and is turned on in response to the output signal of the invert delay unit.

27. The DLL circuit of claim 17,
wherein the duty ratio detection unit is configured to increase the level of the first detection signal above the level of the second detection signal if a high-level period of the first clock is wider than a low-level period thereof, and a high-level period of the second clock is narrower than a low-level period thereof, and to decrease the level of the first detection signal below the level of the second detection signal if the high-level period of the first clock is narrower than the low-level period thereof, and the high-level period of the second clock is wider than the low-level period thereof.

28. The DLL circuit of claim 17,
wherein the voltage comparison unit is configured to disable the first fine control signal when the level of the first detection signal is higher than the level of the second detection signal, and to enable the first fine control signal when the level of the first detection signal is lower than the level of the second detection signal.

29. The DLL circuit of claim 17,
wherein the switching unit includes:
a first switching unit configured to transmit the first fine control signal to the delay control unit when the locking completion signal is disabled; and
a second switching unit configured to transmit the second fine control signal to the delay control unit when the locking completion signal is enabled.

* * * * *